US006872471B2

(12) United States Patent
Epstein et al.

(10) Patent No.: US 6,872,471 B2
(45) Date of Patent: Mar. 29, 2005

(54) INFRARED EMITTING ELECTROLUMINESCENT AND PHOTOLUMINESCENT DEVICES

(75) Inventors: Arthur J. Epstein, Bexley, OH (US); Qianbing Zheng, Powell, OH (US); Run G. Sun, Columbus, OH (US)

(73) Assignee: The Ohio State University Research Foundation, Columbus, OH (US)

(*) Notice: Subject to any disclaimer, the term of this patent is extended or adjusted under 35 U.S.C. 154(b) by 0 days.

(21) Appl. No.: 09/799,171

(22) Filed: Mar. 5, 2001

(65) Prior Publication Data

US 2001/0030325 A1 Oct. 18, 2001

Related U.S. Application Data

(60) Provisional application No. 60/187,278, filed on Mar. 6, 2000.

(51) Int. Cl.[7] .................. H05B 33/00; H01L 31/12; H01S 3/00; G02B 27/00

(52) U.S. Cl. .................. 428/690; 428/917; 313/504; 313/110; 257/80; 257/98; 359/109; 359/350; 372/4; 372/5; 372/6; 372/7; 372/70; 372/81; 372/99; 385/100; 385/101; 385/901

(58) Field of Search .................. 428/690, 917, 428/305.5, 398, 72; 313/504, 110; 359/350, 109; 372/4, 5, 6, 7, 70, 81, 99; 385/100, 101, 901; 257/80, 98

(56) References Cited

U.S. PATENT DOCUMENTS

| 5,128,587 A | * | 7/1992 | Skotheim et al. | ............ 313/504 |
| 2002/0009274 A1 | * | 1/2002 | Gharavi | ....................... 385/122 |
| 2003/0012979 A1 | * | 1/2003 | Verhoeven et al. | .......... 428/690 |

FOREIGN PATENT DOCUMENTS

WO WO 98/55561 12/1998

OTHER PUBLICATIONS

Matsuoka et al., "Electroluminescence of erbium–doped silicon films as grown by ion beam epitaxy", Appl. Phys. Lett. 71 (1) Jul. 1997, pp. 96–98.
Zanatta et al., "Green photoluminescence from Er–containing amorphous SiN thin films", Appl. Phys. Lett., Jun. 1998, vol. 72, No. 24, pp. 3127–3129.
Stimmer et al., "Electroluminescence of erbium–oxygen–doped silicon diodes grown by molecular beam epitaxy", Appl. Phys. Lett. 68 (23), Jun., 1996, pp. 3290–3292.
Tang et al., "Electroluminescence of doped organic thin films", J. Appl. Phys. 65 (9) May 1989, pp. 3610–3616.
Zheng et al., "Room–temperature sharp line electroluminescence at λ=1.54 μm from an erbium–doped, silicon light–emitting diode", Appl. Phys. Lett. 64 (21) May 1994, pp. 2842–2844.

Adachi et al., "Organic Electroluminescent Device with a Three–Layer Structure", Japanese Journal of Applied Physics, vol. 27, No. 4, Apr. 1988, pp. L713–L715.
Braun et al., "Visible light emission from semiconducting polymer diodes", Appl. Phys. Lett. 58 (18), May 1991, pp. 1982–1984.
Kido et al., "Bright red light–emitting organic electroluminescent devices having a europium complex as an emitter", Appl. Phys. Lett. 65 (17), Oct. 1994, pp. 2124–2126.
Tang et al., "Organic electroluminescent diodes", Appl. Phys. Lett. 51 (12), Sep. 1987, pp. 913–915.
Burroughes et al., "Light–emitting diodes based on conjugated polymers", Nature vol. 347, Oct. 1990, pp. 539–541.
Ennen et al., "1.54–μm electroluminescence of erbiumdoped silicon grown molecular beam epitaxy", Appl. Phys. Lett. 46 (4), Feb. 1985, pp. 381–383.
Meng et al., "The Characteristic of Acel in ZnS:Er3+ Thin Films Grown by Atomic Layer Epitaxy Method(ale)" Journal of Luminescence 40 & 41 (1988) 788–789, (no month).
Coffa et al., "Temperature dependence and quenching processes of the intra–4f luminescence of Er in crystalline Si", Physical Review B, vol. 49, No. 23, Jun. 1994, pp. 16313–16320.
Sun et al., "Micrometer Infrared Photoluminescence and Electroluminescence from an Erbium Organic Compound", J. Appl. Phys. May 15, 2000, vol. 87, No. 10, pp. 7589–7591.
Pode, "Photoluminescence in Er(TTA)3(Phen) Thin Film", Physica Status Solidi(a)., Nov. 1998, vol. 170, No. 1, pp. 137–144.
Gillin et al., "Erbium (III) tris (8–hydroxyquinoline) ErQ): A Potential Material for Silicon Compatible 1.5 Micrometer Emitters", Appl. Phys. Lett. Feb. 8, 1999, vol. 74, No. 6, pp. 798–799.
Kawamura et al., "Observation of Neodymium Electroluminescence", Appl. Phys. Lett., May 31, 1999, vol. 74, No. 22, pp. 3245–3247.
Gillin et al., "Organolanthanide Based Infrared Light Emitting Devices", Proceedings of SPIE Photonics for Space Environments VII, Jul. 31–Aug. 1, 2000, vol. 4134, pp. 159–166.
G. H. Dieke, Spectra and Energy Levels of Rare–Earth Ions in Crystals, pp. 294–309 (Interscience, New York, 1968), (no month).

(Continued)

*Primary Examiner*—Marie Yamnitzky
(74) *Attorney, Agent, or Firm*—Standley Law Group LLP

(57) ABSTRACT

The present invention includes infrared emitting materials and infrared emitting devices. The present invention demonstrates 1.54 micron infrared PL and EL emission from an organic complex. This provides a very simple way to obtain a light source at 1.54 micron wavelength that may be both optically and electrically pumped.

44 Claims, 6 Drawing Sheets

OTHER PUBLICATIONS

J. Kido, W. Ikeda, M. Kimura, and K. Nagai, White–Light-Emitting Organic Electroluminescent Device Using Lanthanide Complexes, Jpn. J. Appl. Phys. 35, L394–L396 (Mar. 1996).

S. P. Sinha, Complexes of the Rare Earths, pp. 134–153 (Pergamon, London, 1966), (no month).

R. G. Sun, PhD thesis, Electroluminescence of Polyacetylene Derivatives and Lanthanide Complexes, University of Tokyo, Jun. 1997 (unpublished), 102 pages.

J. Kido, M. Kimura, and Nagai, Multilayer White Light-Emitting Organic Electroluminescent Device, Science 267, 1332–1334 (Mar. 1995).

* cited by examiner

INFRARED EMITTING ELECTROLUMINESCENT AND PHOTOLUMINESCENT DEVICES

This application claims the benefit of Provisional Application Ser. No. 60/187,278 filed Mar. 6, 2000, which is incorporated herein by reference.

The present invention arose through work supported in part by DARPA through a grant monitored by the Army Research Office. The United States Government may have certain rights to this invention under 35 U.S.C. Section 200 et seq.

TECHNICAL FIELD OF THE INVENTION

This invention relates to light-emitting devices driven by an electric field or light source and which are commonly referred to as electroluminescent devices.

BACKGROUND OF THE INVENTION

Conjugated polymer based light-emitting devices have become a topic of great interest since the report of electroluminescent properties in poly(phenylene vinylene) (PPV). A large variety of polymers, copolymers, and their derivatives have been shown to exhibit electroluminescent properties. The configurations of these devices may consist of a simple single layer, bilayers, or blends used to enhance efficiency and tune the emission wavelength, or multilayers that may allow the device to operated under an applied voltage. Typical single layer polymer LEDs are constructed by sandwiching a thin layer of luminescent conjugated polymer between two electrodes, an anode and a cathode, where at least one electrode is either transparent or semi-transparent.

Trivalent erbium ions in different host environments emit photons at several wavelengths, for instance, green emission at 545 nm, and infrared emission at 1.54 and 2.94 microns. This green emission has attracted attention for applications such as fabrication of electroluminescent (EL) devices for use in display technologies. The infrared emission at 1.54 microns is of high interest for optical communication, as this wavelength coincides with the minimum-loss transmission window of silica-based fibers, and the narrow line width of this emission at room temperature also offers high bandwidth capacity in fiber optical communication. Recently, erbium-doped silicon has become a very active field of research for its possible use as electrically pumped light emitters for 1.54 micron wavelength devices. The light emitting devices are based on erbium-doped inorganic materials and prepared by ion implantation, molecular beam epitaxy (MBE), or ion beam epitaxy (IBE) methods. Sharp electroluminescence is observed for these devices at room temperature. Trivalent neodymium and trivalent holmium, when excited, also emit at infrared wavelengths.

Rapid progress has been made in the field of organic EL devices ever since efficient electroluminescence was demonstrated from organic molecular materials. Organic fabrication techniques provide simple and easy methods to construct EL devices with high efficiency and low operating voltages. A variety of organic materials including metal complexes, polymers, and fluorescent dyes have been employed to the fabrication demonstrating different emission colors in the visible wavelength region. Among them, metal complexes such as aluminum tris(8-hydroxyquinoline) are widely used as emitting materials in sublimed molecular film-based EL devices. When coordinated with rare-earth ions, metal complexes exhibit extremely sharp EL emission bands due to the 4f electrons of the ions. Since 4f orbitals are effectively shielded from the influence of external forces by the overlying $5s^2$ and $5p^6$ orbitals, the states arising from the $f^n$ configurations are split by external fields by only about 100 $cm^{-1}$. Moreover, as the central metal ions are excited via intramolecular energy transfer (IMET) from the triplet excited states of the ligand, the EL devices based on metal complexes can be very efficient in principle due to the contribution of triplet states.

It is thus an object of the present invention to develop a cheap, simple electroluminescent or photoluminescent device that demonstrates peak infrared emissions at room temperature.

Although described with respect to the field of light-emitting devices driven by an electric field or optical source, it will be appreciated that similar advantages of infrared emission, as well as other advantages, may be obtained in other applications of the present invention. Such advantages may become apparent to one of ordinary skill in the art in light of the present disclosure or through practice of the invention.

SUMMARY OF THE INVENTION

The present invention includes polymer devices capable of peak emissions in the infrared spectrum. A first device has a cathode layer in contact with a hole transporting polymer layer. The hole transporting polymer may be any polymer adapted to act as a hole transporter, such as those selected from the group consisting of poly(vinylcarbazole)s, poly(diphenylacetylene)s (PDPAs), carbazole substituted PDPAs, poly(fluorene)s, poly(triphenylamine)s, copolymers, or mixtures thereof. An anode layer contacts the hole transporting polymer layer, opposing the cathode layer.

The anode and cathode materials may be selected from any appropriate conductive materials known and used in the field of light emitting polymers. For instance, the cathode material may selected from relatively lower work function metals and semiconductors, such as aluminum, lithium-doped aluminum, calcium, magnesium, and alloys thereof; n-doped conjugated polymers such as n-doped polyacetylene, and n-doped inorganic semiconductors such as n-doped silicon and gallium arsenide.

Examples of typical anode materials include indium tin oxide (ITO), gold, p-doped polymers such as camphor sulfonate acid-doped polyaniline, p-doped polythiophene (PT), or p-doped polypyrrole or their derivatives on ITO, or hole-injecting metal such as gold, or a p-doped inorganic semiconductor such as p-doped silicon and gallium arsenide.

The anode, cathode and optional substrate materials may be selected so that the light generated from the device may egress from either side of the device or along the edge of the device, where the device is constructed as a layered device. For instance, infrared-transparent or semi-infrared-transparent anode and cathode materials may be used to allow the light to egress from one or both sides of the device where a layered construction is provided. As an alternative, infrared-reflective anode and cathode materials may be used so as to allow the light only to egress from the edge of the device where a layered construction is used.

At least one electron transporting molecule is located within the device, the electron transporting molecule having energy levels capable of peak emission(s) within the infrared spectrum. The molecule or moiety may be any molecule comprising a metal-containing molecule capable of such infrared emissions upon excitation. Examples of such electron transporting molecules include metal-containing organic compounds such as metal chelates. Examples of chelates that may be used in accordance with the invention include those of erbium, holmium or neodynium.

Suitable such compounds include tris(acetylacetonato) (1,10-phenanthroline) erbium, tris(acetylacetonato) (1,10-phenanthroline) neodymium, and tris(acetylacetonato) (1,10-phenanthroline) holmium (abbreviated $Er(acac)_3$ (phen), $Nd(acac)_3(phen)$, and $Ho(acac)_3(phen)$). The electron-transporting molecule may also have substitutions on the chelating ligands.

The electron-transporting molecule may be contained in the hole-transporting polymer itself, or in a separate material layer, such as in a separate polymeric layer. Where the electron-transporting molecule is contained in the hole-transporting polymer itself, the electron-transporting molecule may be blended into the hole-transporting polymer, or be included either in the main chain of the hole-transporting polymer, or as a covalently bound substituent group on the main chain of the hole-transporting polymer. Where the electron-transporting molecule is contained in the hole-transporting polymer itself, it is preferred that the electron-transporting molecule be present in an amount of from about 10 percent to about 80 percent by weight of the hole-transporting polymer.

The light emitting polymeric devices of the prevention may also be provided with a substrate support to provide additional dimensional stability, such as those materials known and used in the art. These materials may include opaque, transparent or semi-transparent materials as the particular application requires. Examples include glass and plastic materials, such as infrared-transmitting glass, non-infrared transmitting glass, infrared-transmitting plastic and non-infrared transmitting plastic. The substrates may be flexible, non-flexible, or conformable depending upon the desired application.

The light emitting polymeric devices of the present invention may be driven by any appropriate source of voltage, such as are known and used in the art. These sources may include line current sources, batteries, etc. Where the light emitting polymeric devices of the present invention are electrically driven, the electron driving force may be modulated to generate a frequency- and/or amplitude-modulated infrared source. Modulated electron driving forces may allow light emitting polymeric devices of the present invention to find application in communications, such as is described herein.

It is preferred that the peak emissions of the present invention be relatively discrete 1.54 micron, 1.2 micron, or 2.9 micron emissions, with minimal full-width half-height measurements and no substantial secondary peaks in the infrared region. Other preferred peaks are within the range of 0.5 to 5.0 microns in the near infrared region.

The polymer device may be constructed so as to have at least one edge adapted to allow infrared emission. An optical fiber, such as a silica based optical fiber, may be placed in contact with the light emitting polymeric device in any fashion adapted to allow the optical fiber to receive light emitted from the device. For instance, the optical fiber may be placed against the face or against the edge of a light emitting polymeric device where that device is created as a layered device. Where the optical fiber receives the light from the edge of the light emitting polymeric device, the edge of the hole-transporting polymer may be beveled so as to focus and direct the light into the optical fiber. The fiber may be connected via any appropriate method known in the art, such as by the use of index-matching optical cement.

Light emitting polymeric devices of the present invention may also be constructed using a so-called "SCALE" structure that allows for bipolar operation, as described in U.S. Pat. Nos. 5,663,573 and 5,858,561, hereby incorporated herein by reference.

The present invention also includes light emitting devices featuring the hole-transporting polymer and electron-transporting molecule as described herein, where the device may be optically driven through light excitation (in which case the anode and cathode portions are unnecessary). A source of optical energy is positioned sufficiently near and directed toward the polymer so as to irradiate the polymer, adapted to stimulate infrared emissions from the electron-transporting moiety. A preferred optical source generates photons of approximately 0.9 microns. It is preferred that the electron transporting molecule and hole transporting polymer be as described above.

One edge of the device may be beveled so as to focus the infrared emissions. At this or any appropriate edge/face of the device may be attached an optical fiber, adapted to guide light emitted by the device. The fiber may be attached by any appropriate means.

Another device of the present invention utilizes two layers. The first layer comprises an electron transporting layer having energy levels capable of generating peak emissions in the infrared spectrum. The second layer is a hole transporting polymer layer in contact with the electron transporting layer. The device includes a cathode in contact with the electron transporting layer and an anode in contact with the hole transporting polymer layer. These electrodes may then have a voltage applied so as to generate infrared emissions.

Another two-layer device of the present invention comprises similar electron transporting and hole transporting polymer layers. This device utilizes a source of optical energy in contact with the hole transporting polymer and electron transporting layers to stimulate infrared emissions in the polymer device.

In another embodiment, a light emitting polymeric device of the present invention may be in the form of a cylindrical body or fiber, so as to be able, in one embodiment to be connected to an optical fiber. This construction allows for the production of a source of communication light that may be transmitted down the fiber. The optical fiber comprises a hole transporting polymer and an electron transporting molecule. The device utilizes a source of optical energy in contact with the optical fiber, adapted to stimulate infrared emissions along the fiber. The device may also have an optical receiver in contact with the optical fiber, positioned opposite the optical energy source. An optical receiver may also be placed in contact with the optical fiber opposite the optical energy source. It is preferred that the hole transporting polymer and electron transporting molecule are as described herein.

In another embodiment of the present invention, the optical fiber again comprises a hole transporting polymer and an electron transporting molecule as described herein. An anode layer in placed in contact with the optical fiber, extending over a portion of the circumference of the fiber and running along a portion of the length of the fiber. A cathode layer is placed in contact with the optical fiber, extending over a portion of the circumference of the fiber preferably opposite the anode layer, running along a portion of the length of the fiber similar to the portion of the anode layer. Here, the hole-transporting polymer and electron-transporting molecule may be formed by extrusion, and the anode and cathode materials may be deposited on the sides of the fiber so formed. The deposition may be by any appropriate method, such as silk-screening or vacuum deposition. It is preferred that the hole transporting polymer and electron transporting molecule are selected from those described previously.

Also included in the present invention is an infrared laser device that incorporates a photonic band gap material, the material comprising a semitransparent matrix of periodic hollow cells, such as periodic hollow sphere-like cells. It is preferred that the diameter of each sphere be approximately that of the wavelength of light emitted by the device. A hole transporting polymer is contained in the matrix of periodic hollow cells. An electron transporting molecule, having energy levels capable of peak emissions in the infrared spectrum, is utilized in the device. The device also includes a source of optical energy in contact with the photonic band gap material, adapted to stimulate infrared emissions. It is preferred that the hole transporting polymer and electron transporting molecule be selected from those described herein.

Another embodiment of an infrared laser utilizes the same hole transporting polymer and electron transporting molecule, but uses a pair of mirrors to stimulate lasing. Two parallel mirrors are placed on opposing sides of the hole transporting polymer layer containing the electron transporting I.R. emitting molecule, the reflective side of each mirror facing the polymer layer. The mirrors are preferably planar, and one of the mirrors should be semi-transparent in the infrared spectrum. A source of energy, electrical or optical, is then placed in electrical or optical contact with the polymer layer so as to stimulate infrared emissions that are primarily orthogonal to the planes of the mirrors. The elements should be arranged such that light emitted from the electron transporting molecule will be reflected back and forth between the two mirrors through the polymer layer until passing through the infrared semi-transparent mirror. The effect of several similar emissions is that the emitted light will begin to lase. The laser may be placed in contact with optical fibers for communication purposes or to transmit the light.

The present invention also includes a communication system. An optical fiber network, comprising at least one polymer fiber, is used to send optical signals. The polymer fiber comprises a hole transporting polymer and an electron transporting molecule, the molecule having energy levels capable of peak emissions in the infrared spectrum. It is preferred that the emissions be at 1.54 or 2.9 microns. A transmission device is placed in contact with the polymer fiber, the transmission device adapted to stimulate infrared emissions in that fiber. An infrared reception device is then placed in contact with the optical fiber network, the infrared reception device adapted to receive infrared emissions propagated along the fiber network. It is preferred that the hole transmitting polymer and electron transporting molecule are selected from those described above.

The present invention also includes optical amplifiers that may be made using the arrangements of the present invention. Optical amplifiers may be used in high-speed optical transmission systems. Optical amplifiers may span portions of the lightwave spectrum, and may be used to increase the optical bandwidth of amplifiers used in commercial wavelength-division multiplexed (WDM) communications systems. WDM is a technique for transmitting a mix of voice, data and video, in the ones and zeros of digital information, over various wavelengths, or colors, of light. The present invention may be used to provide optical amplifiers capable of operating in the infrared spectrum.

The present invention may also include lasers made using the polymers and arragements of the present invention.

DETAILED DESCRIPTION OF THE PREFERRED EMBODIMENTS

In accordance with the foregoing summary, the following present a detailed description of the preferred embodiment of the invention that is currently considered to be the best mode.

Figure 1:
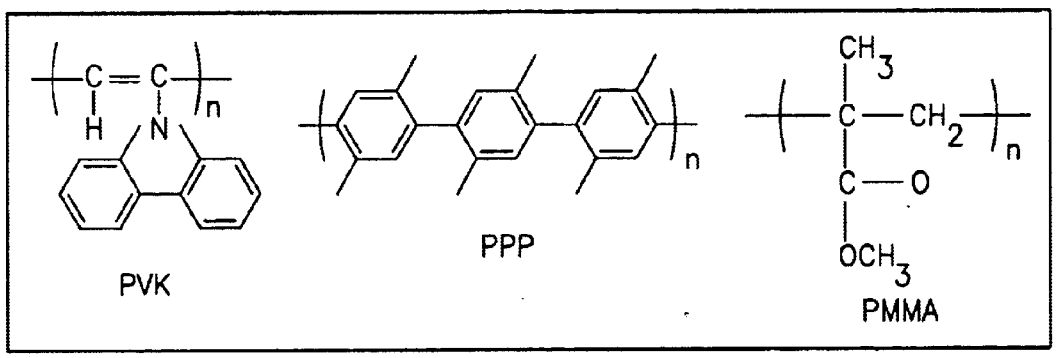
FIG. 1 shows an example of host polymers of the present invention.
Figure 2:
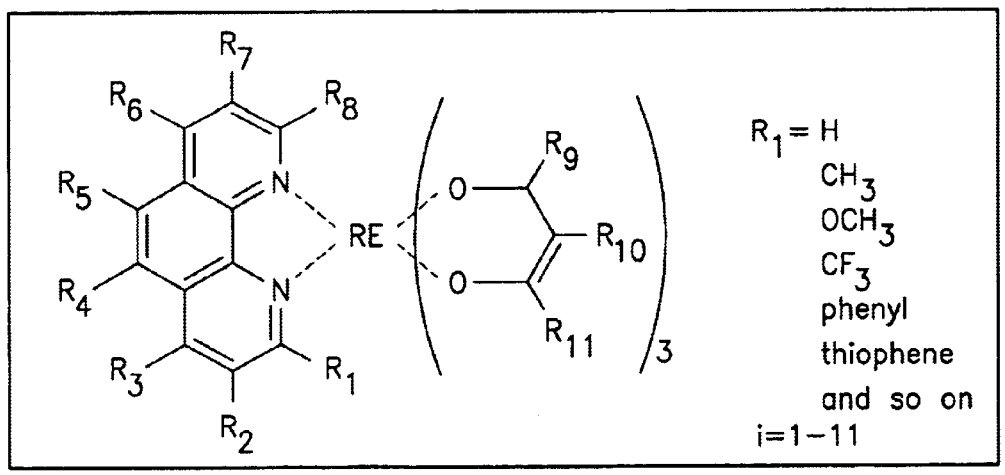
FIG. 2 shows an example of a rare earth (RE) chelate complex of the present invention.
Figure 3:
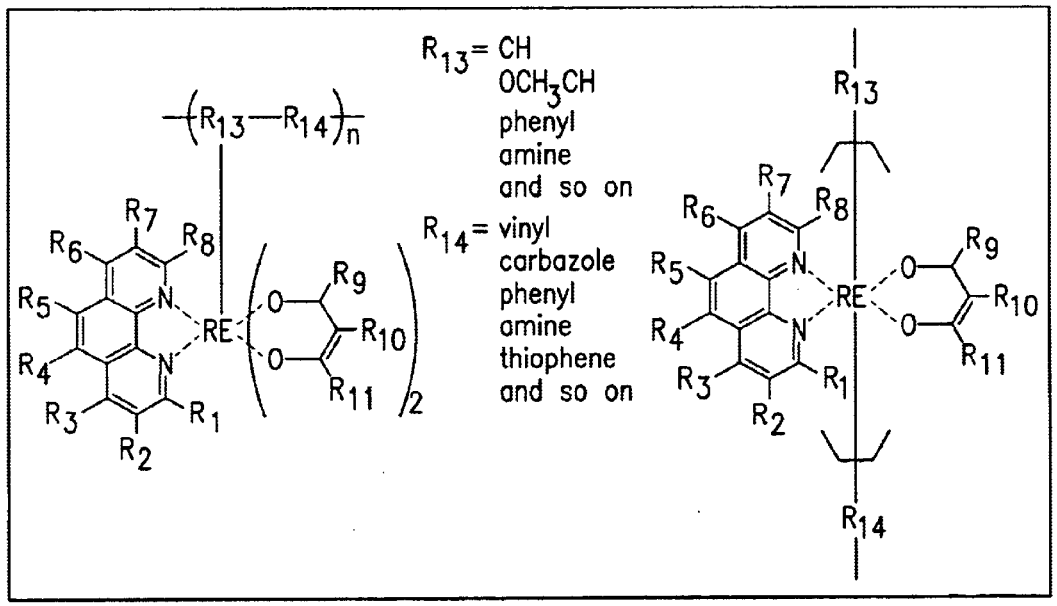
FIG. 3 shows examples of rare earth chelate complex containing polymers of the present invention.
Figure 4:
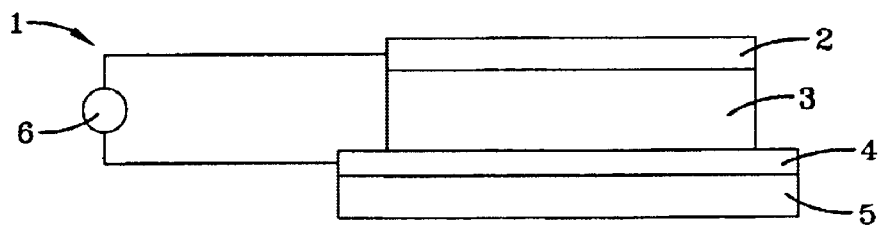
FIG. 4 shows a single layer infrared light emitting electroluminescent device of the present invention.

The erbium complex, $Er(acac)_3(phen)$, may be synthesized by the conventional method. To fabricate the EL devices from the compound, poly(N-vinylcarbazole) (PVK) may be employed as a host polymer. Thin films of PVK doped with $Er(acac)_3(phen)$ are preferably prepared by spin coating from PVK:$Er(acac)_3(phen)$ (10:8 by weight ratio) dichloroethane solution. The sheet resistance of ITO (indium-tin oxide coated glass) substrate may be 20 $\Omega$/square. The thickness of the $Er(acac)_3(phen)$-doped PVK film is preferably about 80 nm. A single-layer type of EL devices may be constructed as ITO/PVK:$Er(acac)_3(phen)$/Al:Li/Ag (bi-layer devices with separate PVK and $Er(acac)_3(phen)$ layers have also been fabricated, showing similar EL). The metal cathode Al:Li(0.1%) (100 nm) may be thermally deposited in a vacuum chamber of $1\times10^{-7}$ torr. The luminescent area of the devices for test purposes may be 0.25 mm$^2$. The PL and EL spectra may be recorded with a spectrometer, such as a Bruker IFS66/S, at room temperature. The EL devices are preferably driven by a DC bias in air. FIG. 4 shows a schematic structure of an EL device 1 of the present invention. The EL device 1 shown has an ITO/PVK:$Er(acac)_3(phen)$/Al:Li/Ag structure, where the PVK:$Er(acac)_3(phen)$ EL polymer layer 3 is coated onto an indium-tin oxide 4 coated glass substrate 5 (the anode) and then coated by an Al:Li/Ag layer 2 (the cathode). A source of electrical energy 6 may then be connected to the anode 4 and cathode 2. FIG. 1 shows the chemical structure of a preferred PVK material of the present invention. FIG. 2 shows the chemical structure of preferred RE chelate complexes. FIG. 3 shows the chemical structure of preferred RE chelate complexes containing polymers.

Figure 5:
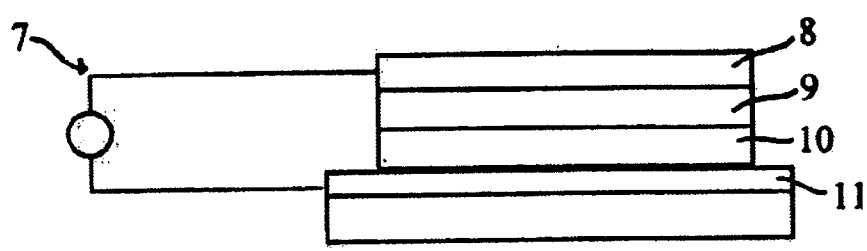
FIG. 5 shows a two layer infrared light emitting electroluminescent device of the present invention.
Figure 6:
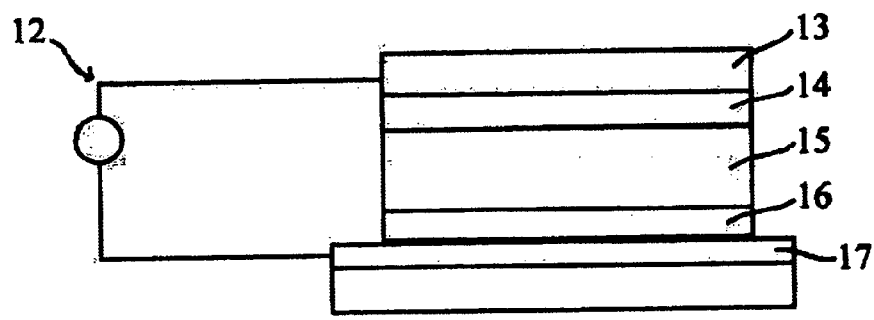
FIG. 6 shows a three layer infrared light emitting electroluminescent device of the present invention.
Figure 7:
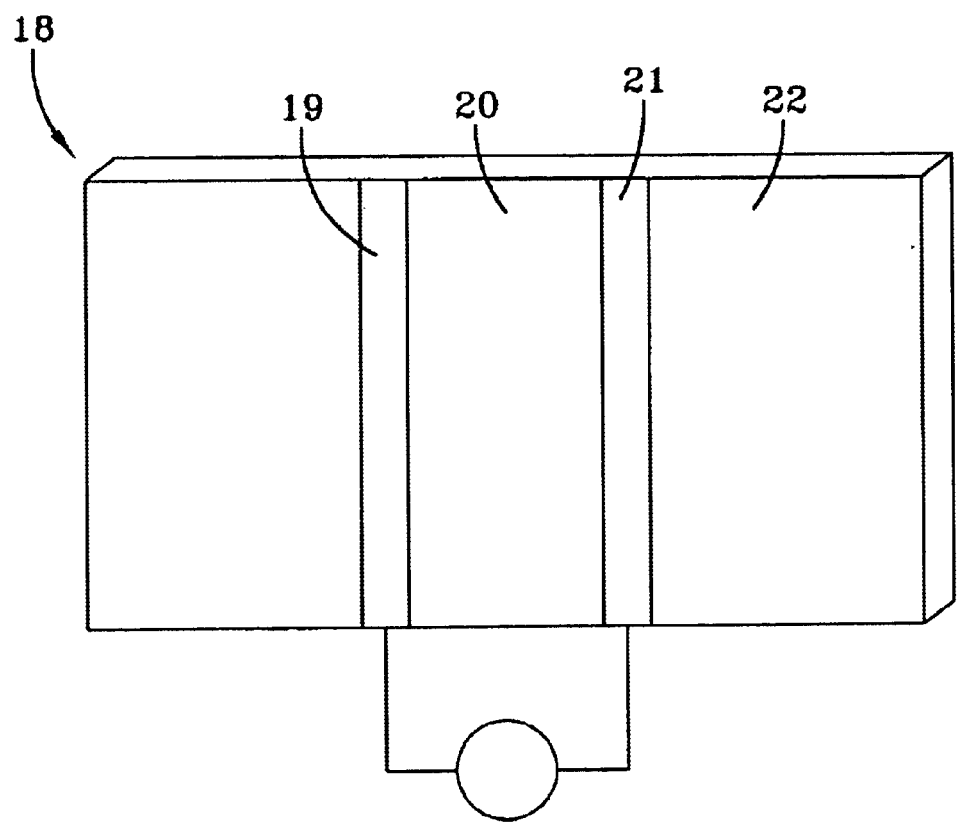
FIG. 7 shows an embodiment of an infrared light emitting electroluminescent device of the present invention wherein the electroluminescent device is operated on a surface.
Figure 8:
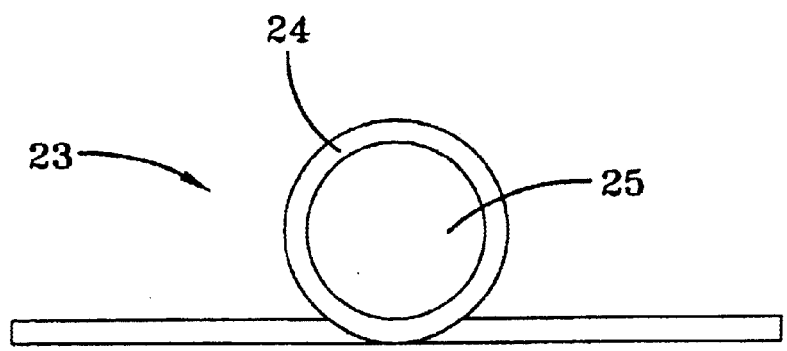
FIG. 8 shows an infrared light emitting electroluminescent fiber of the present invention.

Another preferred embodiment of a device 7 is shown in FIG. 5, where a layer of electron transporting RE chelate complex containing polymer 9 and a hole transporting polymer layer 10 are placed between the anode 11 and cathode 8. FIG. 6 shows an embodiment of a preferred device 12 wherein a first layer 14 and second layer 16 of a conducting polymer material are placed between a blended electron transporting infrared emitting moiety and hole transporting host layer 15 and the electrodes 13 and 17. FIG. 7 shows an embodiment of a preferred planar device 18 wherein the anode 19, polymer blend 20, and cathode 21 all lie in a plane on the surface of a substrate 22. FIG. 8 shows an embodiment of a preferred device 23 wherein a hole transporting polymer fiber 25, shown in side view, incorporates an infrared emitting electron transporting molecule, or is surrounded by a transparent or semi-transparent electron transporting infrared emitting molecule layer 24. Optical energy may then be directed at the fiber 25 so as to stimulate infrared emission.

Figure 9:
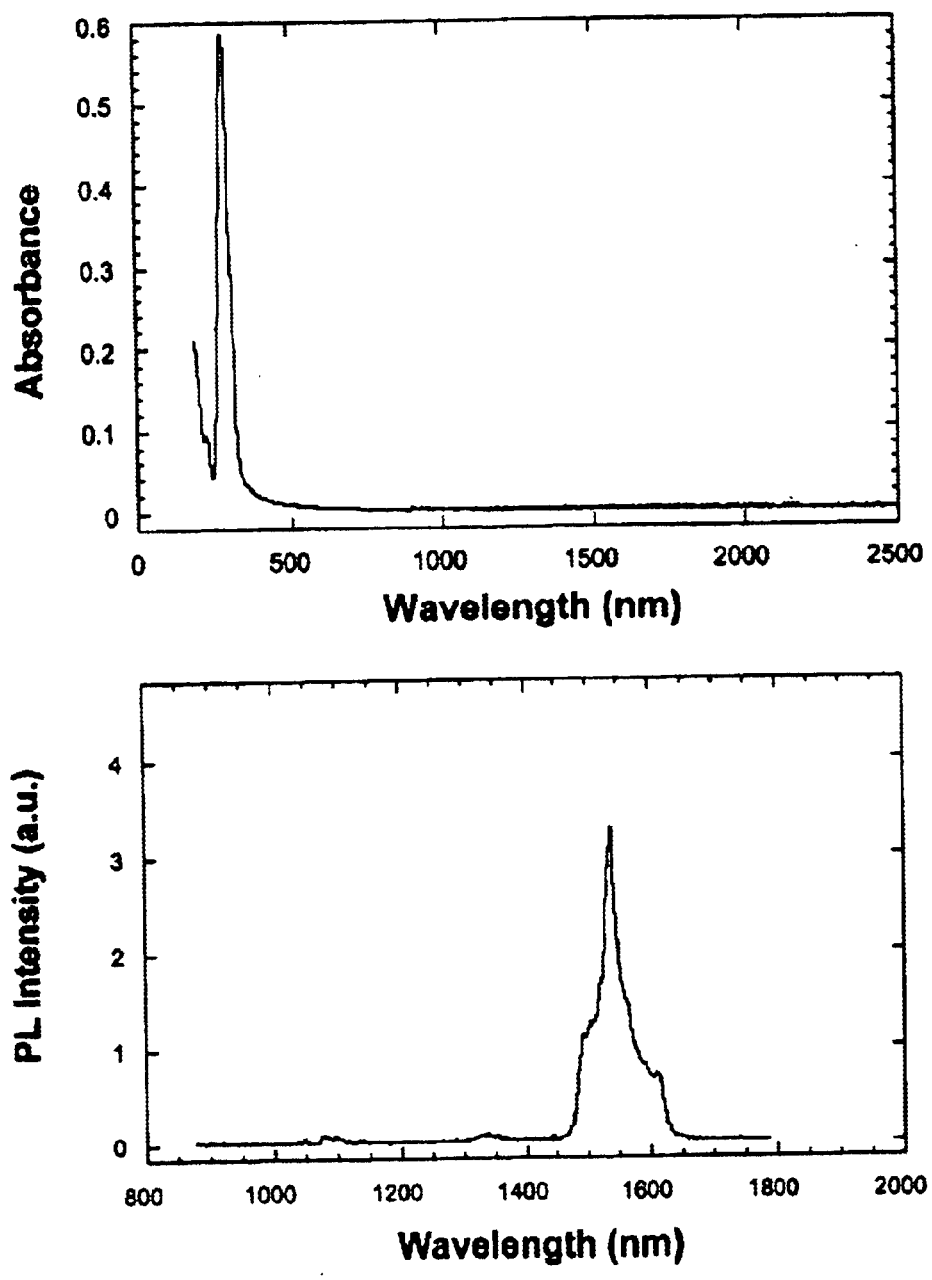
FIG. 9 shows plots of absorbance and photoluminescence for $Er(acac)_3(phen)$ used in accordance with the present invention.

The absorption spectrum of $Er(acac)_3(phen)$ vacuum-evaporated film (about 20 nm) on a quartz substrate is shown in FIG. 9. The absorption of $Er(acac)_3(phen)$ in the wavelength region of 600 to 350 nm is due to the charge transfer states formed between the ligands and the central Er ion. The relatively sharp absorption peak at 285 nm is from the phenanthroline ligand. There is no absorption from the Er ion because of the shielding effect of the ligands surrounding the erbium ion. The PL spectrum of $Er(acac)_3(phen)$ excited by the 350 nm excitation line, as shown in FIG. 9, exhibits a sharp emission peak at 1.54 microns. The luminescence originates from the $^4I_{13/2} \rightarrow {}^4I_{15/2}$ transition of the partially filled $4f$ shell. Because the $4f$ shell is well shielded by the outer $5s^2$ and $5p^6$ orbits, the energy of this transition is relatively independent of the ligands and ambient temperature. $Er(acac)_3(phen)$ shows no emission in the visible range when excited by the 350 nm light, which suggests that the $^4I_{13/2} \rightarrow {}^4I_{15/2}$ transition might be the most favorable transition. The absolute PL efficiency of $Er(acac)_3(phen)$ remains unknown. However, the other lanthanide complexes such as $Eu(acac)_3(phen)$ and $Tb(acac)_3(phen)$ with the same ligands and lanthanide electronic configurations, which emit in the red and green wavelength ranges, show PL efficiencies as high as 10%.

There are at least two methods to form erbium-ion containing polymer films: a first method is to covalently bind an erbium ion complex to a polymer main chain; and a second is to blend an erbium complex into a host polymer. As $Er(acac)_3(phen)$ is soluble in some common solvents such as tetrahydrofuran and chloroform, one may select the latter method and use poly(N-vinylcarbazole) (PVK) as a host polymer. The $Er(acac)_3(phen)$-doped PVK when excited with a 350 nm source shows the same 1.54 micron PL emission as that in FIG. 9. This method of doping erbium complexes into polymer matrices may provide a way to fabricate optically pumped infrared emitters for possible applications. The host polymer is not limited only to PVK. As an example, the erbium complex may also be doped into poly(methyl methacrylate) (PMMA), which is a common polymer matrix material.

Figure 10:
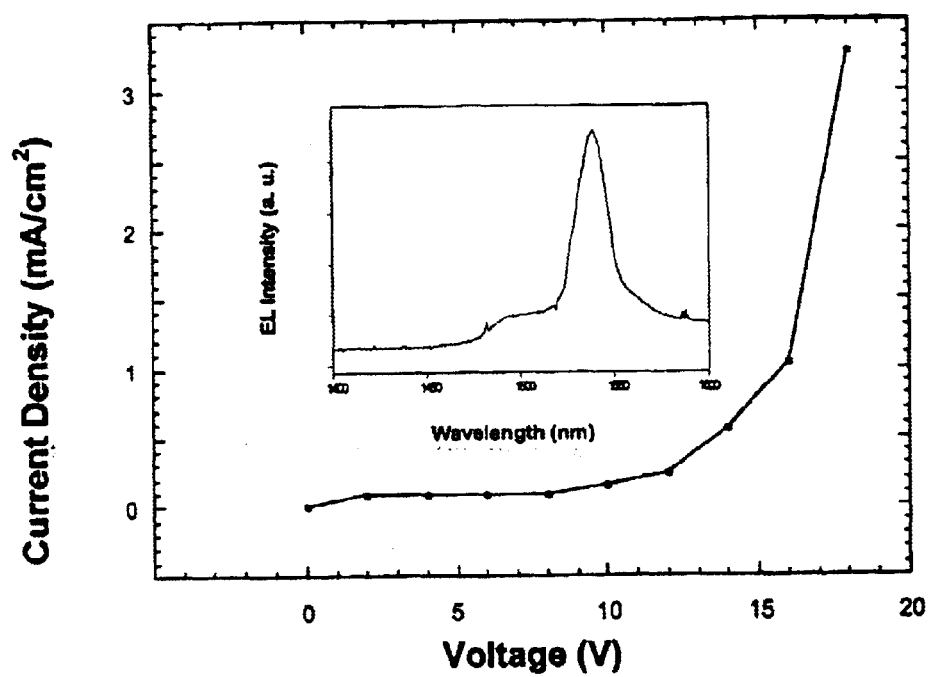
FIG. 10 shows a current vs. voltage curve for ITO:PVK: $Er(acac)_3(phen)$/Li:Al and an inset plot of the electroluminescence of such a device used in accordance with the present invention.

A single-layer EL device may be prepared using PVK:Er(acac)$_3$(phen) as an emitting layer. The weight ratio of $Er(acac)_3(phen)$ and PVK is preferably 8:10. PVK is a hole-transporting polymer and emits blue light. Therefore, its excitation energy may be efficiently transferred to $Er(acac)_3(phen)$, the absorption of which is within 350 to 600 nm. $Er(acac)_3(phen)$ itself is an electron transporting molecule via the phenanthroline ligand. The EL of ITO/PVK:Er(acac)$_3$(phen)/Al:Li/Ag device may be observed under 10 V DC bias (using ITO as the anode). FIG. 10 shows the current-voltage (I-V) curve and the EL spectrum (inset) in the infrared region, which is from the Er ion peaked at 1.54 microns. Since ITO-coated glass used as the anode transmits only about 20% light around 1.5 microns, it may limit the output of the infrared light. In the visible range, there may be a weak broad band EL emission of the background from 480 to 610 nm which is proposed to originate from an exciplex formed by PVK and $Er(acac)_3(phen)$, as neither PVK and $Er(acac)_3(phen)$ may emit at this region. The EL quantum yield (photons/ electron) in this device is still unknown. The EL efficiency of a terbium complex Tb(acac)$_3$(phen) with the similar device structure, i.e. ITO/PVK:Tb(acac)$_3$(phen)/Mg, is about 0.1%.

One possible electroluminescence excitation process of PVK:Er(acac)$_3$(phen) blends may be accomplished as follows. When a bias is applied to the device, holes may be injected and transported into the EL layer via PVK (through the carbazole side group) and electrons via phenanthroline ligands of $Er(acac)_3(phen)$; the holes and electrons may then recombine to generate excitons. The energy of excitons may be transferred to the ligands of $Er(acac)_3(phen)$ through Förster energy transfer and finally to the erbium ion. The radiative transition of $^4I_{13/2} \rightarrow {}^4I_{15/2}$ of the excited erbium ion may lead to infrared light emission at 1.54 microns.

The preferred embodiments herein disclosed are not intended to be exhaustive or to unnecessarily limit the scope of the invention. The preferred embodiments were chosen and described in order to explain the principles of the present invention so that others skilled in the art may practice the invention. Having shown and described preferred embodiments of the present invention, it will be within the ability of one of ordinary skill in the art to make alterations or modifications to the present invention, such as through the substitution of equivalent materials or structural arrangements, or through the use of equivalent process steps, so as to be able to practice the present invention without departing from its spirit as reflected in the appended claims, the text and teaching of which are hereby incorporated by reference herein. It is the intention, therefore, to limit the invention only as indicated by the scope of the claims and equivalents thereof.

References

1. G. H. Dieke, *Spectra and Energy Levels of Rare-Earth Ions in Crystals* (Interscience, New York, 1968).
2. L. J. Meng and G. Z. Zhong, J. Lumin. 40–41, 788 (1988).
3. A. R. Zanatta and L. A. Nunes, Appl. Phys. Lett. 72, 3127 (1998).
4. H. Ennen, G. Pomrenke, A. Axmann, K. Eisele, W. Haydi, and J. Schneider, Appl. Phys. Lett. 46, 381 (1985).
5. B. Zheng, J. Michel, F. Y. G. Ren, L. K. Kimerling, D. C. Jacobson, and J. M. Poate, Appl. Phys. Lett. 64, 2842 (1994).
6. S. Coffa, G. Franzo, F. Priolo, A. Polman, and R. Serna, Phys. Rev. B 49, 16313 (1994).
7. J. Stimmer, A. Reittinger, J. F. Nutzel, G. Abstreiter, H. Holzbrecher, and Ch. Buchal, Appl. Phys. Lett. 68, 3290 (1996).
8. M. Matsuoka and S. Tohno, Appl. Phys. Lett. 71, 96 (1997).
9. C. W. Tang and S. A. VanSlyke, Appl. Phys. Lett. 51, 913 (1987).
10. C. W. Tang, S. A. VanSlyke, and C. H. Chen, J. Appl. Phys. 65, 3610 (1989).

11. J. H. Burroughes, D. D. C. Bradley, A. R. Brown, R. N. Marks, K. Mackay, R. H. Friend, P. L. Burns and A. B. Holmes, Nature 347, 539 (1990).
12. D. Braun and A. J. Heeger, Appl. Phys. Lett. 58,1982 (1991).
13. C. Adachi, S. Tokito, T. Tsutsui, and S. Saito, Jpn. Appl. Phys. Lett. 27, L713 (1988).
14. J. Kido, H. Hayase, K. Hongawa, K. Nagai, and K. Okuyama, Appl. Phys. Lett. 65,2124 (1994).
15. J. Kido, W. Ikeda, M. Kimura, and K. Nagai, Jpn. J. Appl. Phys. 35, L394 (1996).
16. S. P. Sinha, *Complexes of the Rare Earth* (Pergamon, London, 1966).
17. W. P. Gillin and R. J. Curry, Appl. Phys. Left. 74, 798 (1999).
18. R. G. Sun, PhD thesis, University of Tokyo, 1997 (unpublished).
19. J. Kido, M. Kimura, and Nagai, Science 267,1332 (1995).

The foregoing references are hereby incorporated herein by reference.

What is claimed is:

1. An infrared light emitting polymer device, said infrared light emitting polymer device comprising:
    (a) a hole transporting polymer;
    (b) a layer, said layer adjacent to said hole transporting polymer, said layer comprising at least one electron transporting molecule, said electron transporting molecule having energy levels capable of peak emissions in the infrared spectrum, wherein said electron transporting molecule comprises at least one rare earth metal containing chelating organic compound selected from the group consisting of tris(acetylacetonato) (1,10-phenanthroline) erbium, tris(acetylacetonato) (1,10-phenanthroline) neodymium, and tris(acetylacetonato) (1,10-phenanthroline) holmium; and
    (c) a source of optical energy positioned so as to irradiate said hole transporting polymer such that said source of optical energy stimulates infrared emissions from said electron transporting molecule.

2. An infrared light emitting polymer device according to claim 1 wherein said hole transporting polymer is selected from the group consisting of poly(vinylcarbazole)s, poly(diphenylacetylene)s (PDPAs), carbazole substituted PDPAs, poly(fluorene)s, poly(triphenylamine)s, derivatives, copolymers, and mixtures thereof.

3. An infrared light emitting polymer device according to claim 1 wherein said hole transporting polymer is blended with at least one rare earth metal containing chelating organic compound.

4. An infrared light emitting polymer device according to claim 3 wherein said rare earth metal containing chelating organic compound blended with said hole transporting polymer is present in an amount of from about 10% to about 80% by weight of said hole transporting polymer.

5. An infrared light emitting polymer device according to claim 1 wherein said peak emissions have a wavelength in the range of from about 0.7 micron to about 5.0 microns.

6. An infrared light emitting polymer device according to claim 1 additionally comprising an optical fiber attached to said device, said optical fiber adapted to guide light emitted by said device, wherein said device is constructed so as to have at least one face or edge in contact with said optical fiber adapted to allow infrared emission.

7. An infrared light emitting polymer device according to claim 6 wherein said at least one edge is beveled so as to focus the infrared emissions.

8. An infrared light emitting polymer device, said infrared light emitting polymer device comprising:
    (a) an optical fiber, said optical fiber comprising a hole transporting polymer and an electron transporting molecule, said electron transporting molecule having energy levels capable of peak emissions in the infrared spectrum, wherein said electron transporting molecule comprises at least one rare earth metal containing chelating organic compound selected from the group consisting of tris(acetylacetonato) (1,10-phenanthroline) erbium, tris(acetylacetonato) (1,10-phenanthroline) neodymium, and tris(acetylacetonato) (1,10-phenanthroline) holmium; and
    (b) a source of optical energy in contact with said optical fiber, said source of optical energy adapted to stimulate infrared emissions along said optical fiber.

9. An infrared light emitting polymer device according to claim 8 wherein said hole transporting polymer is selected from the group consisting of poly(vinylcarbazole)s, poly(diphenylacetylene)s (PDPAs), carbazole substituted PDPAs, poly(fluorene)s, poly(triphenylamine)s, derivatives, copolymers, and mixtures thereof.

10. An infrared light emitting polymer device according to claim 8, wherein said hole transporting polymer is blended with at least one rare earth metal containing chelating organic compound.

11. An infrared light emitting polymer device according to claim 10 wherein said rare earth metal containing chelating organic compound blended with said hole transporting polymer is present in an amount of from about 10% to about 80% by weight of said hole transporting polymer.

12. An infrared light emitting polymer device according to claim 8 wherein said peak emissions have a wavelength in the range of from about 0.7 micron to about 6.0 microns.

13. An infrared light emitting polymer device according to claim 8 additionally comprising an optical receiver or other optical fiber in contact with said optical fiber opposite said source of optical energy.

14. An infrared light emitting polymer device, said infrared light emitting polymer device comprising:
    (a) an optical fiber, said optical fiber comprising a hole transporting polymer and an electron transporting molecule, said electron transporting molecule having energy levels capable of peak emissions in the infrared spectrum, wherein said electron transporting molecule comprises at least one rare earth metal containing chelating organic compound selected from the group consisting of tris(acetylacetonato) (1,10-phenanthroline) erbium, tris(acetylacetonato) (1,10-phenanthroline) neodymium, and tris(acetylacetonato) (1,10-phenanthroline) holmium;
    (b) an anode layer in contact with said optical fiber, said anode layer extending over a portion of the circumference of said fiber and running along a portion of the length of said fiber; and
    (c) a cathode layer in contact with said optical fiber, said anode layer extending over a portion of the circumference of said fiber opposite said anode layer, said cathode layer running along a portion of the length of said fiber similar to said portion of said anode layer.

15. An infrared light emitting polymer device according to claim 14 wherein said hole transporting polymer is selected from the group consisting of poly(vinylcarbazole)s, poly(diphenylacetylene)s (PDPAs), carbazole substituted PDPAs, poly(fluorene)s, poly(triphenylamine)s, derivatives, copolymers, and mixtures thereof.

16. An infrared light emitting polymer device according to claim 14 wherein said hole transporting polymer is blended with at least one rare earth metal containing chelating organic compound.

17. An infrared light emitting polymer device according to claim 14 wherein said rare earth metal containing chelating organic compound is present in an amount of from about 10% to about 80% by weight of said hole transporting polymer.

18. An infrared light emitting polymer device according to claim 14 wherein said peak emissions have a wavelength in the range of from about 0.7 micron to about 5.0 microns.

19. An infrared light emitting polymer device according to claim 14 additionally comprising an optical receiver in contact with said optical fiber opposite a source of optical energy.

20. An infrared laser device, said infrared laser device comprising:
    (a) a photonic band gap material, said photonic band gap material comprising a semi-transparent matrix of hollow cells;
    (b) a hole transporting polymer, said hole transporting polymer contained in said semi-transparent matrix of hollow cells;
    (c) an electron transporting molecule in electrical communication with said hole transporting polymer, said electron transporting molecule having energy levels capable of peak emissions in the infrared spectrum; and
    (d) a source of optical energy in contact with said photonic band gap material, said source of optical energy adapted to stimulate infrared emissions.

21. An infrared laser device according to claim 20 wherein said hole transporting polymer is selected from the group consisting of poly(vinylcarbazole)s, poly(diphenylacetylene)s (PDPAs), carbazole substituted PDPAs, poly(fluorene)s, poly(triphenylamine)s, derivatives, copolymers, and mixtures thereof.

22. An infrared laser device according to claim 20 wherein said electron transporting molecule comprises at least one rare earth metal containing chelating organic compound.

23. An infrared laser device according to claim 22 wherein said at least one rare earth metal containing chelating organic compound is blended into said hole transporting polymer.

24. An infrared laser device according to claim 20 wherein said peak emissions have a wavelength in the range of from about 0.7 micron to about 5.0 microns.

25. An infrared laser device according to claim 20 wherein the diameter of each cell in said matrix of hollow cells is approximately the wavelength of said infrared emissions.

26. An infrared laser device, said infrared laser device comprising:
    (a) a hole transporting polymer layer;
    (b) an electron transporting molecule in electrical contact with said hole transporting layer, said electron transporting molecule having energy levels capable of peak emissions in the infrared spectrum;
    (c) first and second mirrors, said hole transporting polymer layer located between said first and second mirrors, said first mirror opposing and parallel to said second mirror such that the reflective sides of said first and second minors are facing said hole transporting polymer, at least one of said first and second mirrors being semi-transparent in the infrared region; and
    (d) a source of energy in contact with said hole transporting polymer and said electron transporting molecule, said source of energy adapted to stimulate infrared emissions primarily orthogonal to the planes of said first and second mirrors.

27. An infrared laser device according to claim 26 wherein said hole transporting polymer is selected from the group consisting of poly(vinylcarbazole)s, poly(diphenylacetylene)s (PDPAs), carbazole substituted PDPAs, poly(fluorene)s, poly(triphenylamine)s, derivatives, copolymers, and mixtures thereof.

28. An infrared laser device according to claim 26 wherein said electron transporting molecule comprises at least one rare earth metal containing chelating organic compound.

29. An infrared laser device according to claim 28 wherein said at least one rare earth metal containing chelating organic compound is blended into said hole transporting polymer.

30. An infrared laser device according to claim 26 wherein said peak emissions have a wavelength in the range of from about 0.7 micron to about 5.0 micron.

31. An infrared laser device according to claim 26 wherein said source of energy is selected from the group consisting of electrical and optical sources of energy.

32. A communication system, said communication system comprising:
    (a) an optical fiber network, said optical fiber network comprising at least one polymer fiber, said at least one polymer fiber comprising a hole transporting polymer and an electron transporting molecule, said electron transporting molecule having energy levels capable of peak emissions in the infrared spectrum;
    (b) a transmission device in contact with said at least one polymer fiber, said transmission device adapted to stimulate infrared emissions in said at least one polymer fiber; and
    (c) an infrared reception device in contact with said optical fiber network, said infrared reception device adapted to receive infrared emissions propagated along said optical fiber network.

33. A communication system according to claim 32 wherein said hole transporting polymer is selected from the group consisting of poly(vinylcarbazole)s, poly(diphenylacetylene)s (PDPAs), carbazole substituted PDPAs, poly(fluorene)s, poly(triphenylamine)s, derivatives, copolymers, and mixtures thereof.

34. A communication system according to claim 32 wherein said electron transporting molecule comprises at least one rare earth metal containing chelating organic compound.

35. A communication system according to claim 34 wherein said at least one rare earth metal is selected from the group consisting of erbium, neodymium, and holmium.

36. A communication system according to claim 34 wherein said at least one rare earth metal containing chelating organic compound is selected from the group consisting of tris(acetylacetonato) (1,10-phenanthroline) erbium, tris(acetylacetonato) (1,10-phenanthroline) neodymium, and tris(acetylacetonato) (1,10-phenanthroline) holmium.

37. A communication system according to claim 34 wherein said at least one rare earth metal containing chelating organic compound is blended into said hole transporting polymer.

38. A communication system according to claim 37 wherein said rare earth metal containing chelating organic compound is present in an amount of from about 10% to about 80% by weight of said hole transporting polymer.

39. A communication system according to claim 32 wherein said peak emissions have a wavelength in the range of from about 0.7 micron to about 5.0 microns.

40. An infrared light emitting polymer device, said infrared emitting polymer device comprising:
   (a) a hole transporting polymer, wherein said hole transporting polymer is blended with at least one rare earth metal containing chelating organic compound selected from the group consisting of tris(acetylacetonato) (1,10-phenanthroline) erbium, tris(acetylacetonato) (1,10-phenanthroline) neodymium, and tris(acetylacetonato) (1,10-phenanthroline) holmium;
   (b) a layer, said layer adjacent to said hole transporting polymer, said layer comprising at least one electron transporting molecule, said electron transporting molecule having energy levels capable of peak emissions in the infrared spectrum; and
   (c) a source of optical energy positioned so as to irradiate said hole transporting polymer such that said source of optical energy stimulates infrared emissions from said electron transporting molecule.

41. The infrared light emitting polymer device according to claim 40 wherein said rare earth metal containing chelating organic compound is present in an amount of from about 10% to about 80% by weight of said hole transporting polymer.

42. The infrared light emitting polymer device according to claim 40 additionally comprising an optical fiber attached to said device, said optical fiber adapted to guide light emitted by said device, wherein said device is constructed so as to have at least one face or edge in contact with said optical fiber adapted to allow infrared emission.

43. An infrared light emitting polymer device, said infrared light emitting polymer device comprising:
   (a) an optical fiber, said optical fiber comprising a hole transporting polymer and an electron transporting molecule, said electron transporting molecule having energy levels capable of peak emissions in the infrared spectrum, wherein said hole transporting polymer is blended with at least one rare earth metal containing chelating organic compound selected from the group consisting of tris(acetylacetonato) (1,10-phenanthroline) erbium, tris(acetylacetonato) (1,10-phenanthroline) neodymium, and tris(acetylacetonato) (1,10-phenanthroline) holmium; and
   (b) a source of optical energy in contact with said optical fiber, said source of optical energy adapted to stimulate infrared emissions along said optical fiber.

44. An infrared light emitting polymer device, said infrared light emitting polymer device comprising:
   (a) an optical fiber, said optical fiber comprising a hole transporting polymer and an electron transporting molecule, said electron transporting molecule having energy levels capable of peak emissions in the infrared spectrum, wherein said hole transporting polymer is blended with at least one rare earth metal containing chelating organic compound selected from the group consisting of tris(acetylacetonato) (1,10-phenanthroline) erbium, tris(acetylacetonato) (1,10-phenanthroline) neodymium, and tris(acetylacetonato) (1,10-phenanthroline) holmium;
   (b) an anode layer in contact with said optical fiber, said anode layer extending over a portion of the circumference of aid fiber and running along a portion of the length of said fiber; and
   (c) a cathode layer in contact with said optical fiber, said cathode layer extending over a portion of the circumference of said fiber opposite said anode layer, said cathode layer running along a portion of the length of said fiber and having a length similar to said anode layer.

* * * * *

UNITED STATES PATENT AND TRADEMARK OFFICE
CERTIFICATE OF CORRECTION

PATENT NO. : 6,872,471 B2
DATED : March 29, 2005
INVENTOR(S) : Epstein et al.

It is certified that error appears in the above-identified patent and that said Letters Patent is hereby corrected as shown below:

Title page,
Item [56], References Cited, OTHER PUBLICATIONS, please delete "Ennen et al., "1.54-µm electroluminescence of erbiumdoped silicon grown molecular beam epitaxy", Appl. Phys. Lett. 46 (4), Feb. 1985, pp. 381-383." and insert -- Ennen et al., "1.54-µm electroluminescence of erbium-doped silicon grown molecular beam epitaxy", Appl. Phys. Lett. 46 (4), February 1985, pp. 381-383. --.

Column 8,
Lines 25-26, please delete "F örster" and insert -- Förster --.
Lines 52-53, please delete "4. H. Ennen, G. Pomrenke, A. Axmann, K. Eisele, W. Haydi, and J. Schneider, Appl. Phys. Lett. 46, 381 (1985)." and insert -- 4. H. Ennen, G. Pomrenke, A. Axmann, K. Eisele, W. Haydl, and J. Schneider, Appl. Phys. Lett. 46, 381 (1985). --.

Column 10,
Line 34, please delete ".7 micron to about 6.0 microns" and insert -- .7 micron to about 5.0 microns --.
Lines 57-81, please delete "(c) a cathode layer in contact with said optical fiber, said anode layer extending over a portion of the circumference of said fiber opposite said anode layer, said cathode layer running along a portion of the length of said fiber similar to said portion of said anode layer." and insert -- (c) a cathode layer in contact with said optical fiber, said cathode layer extending over a portion of the circumference of said fiber opposite said anode layer, said cathode layer running along a portion of the length of said fiber and having a length similar to said anode layer. --.

UNITED STATES PATENT AND TRADEMARK OFFICE
CERTIFICATE OF CORRECTION

PATENT NO.    : 6,872,471 B2
DATED         : March 29, 2005
INVENTOR(S)   : Epstein et al.

It is certified that error appears in the above-identified patent and that said Letters Patent is hereby corrected as shown below:

Column 14,
Line 29, please delete "aid" and insert -- said --.

Signed and Sealed this

Twenty-eighth Day of June, 2005

JON W. DUDAS
*Director of the United States Patent and Trademark Office*